United States Patent [19]

Hasegawa

[11] Patent Number: 4,563,640
[45] Date of Patent: Jan. 7, 1986

[54] FIXED PROBE BOARD

[76] Inventor: Yoshiei Hasegawa, 7-9, Wakamatsu 6-chome, Sagamihara-shi, Kanagawa-ken, Japan

[21] Appl. No.: 374,521

[22] Filed: May 3, 1982

[30] Foreign Application Priority Data

Jun. 3, 1981 [JP] Japan ................................. 56-86167

[51] Int. Cl.⁴ ........................ G01R 1/06; G01R 31/02
[52] U.S. Cl. ............................... 324/158 P; 324/72.5; 324/158 F
[58] Field of Search ................ 324/158 P, 158 F, 72.5

[56] References Cited

U.S. PATENT DOCUMENTS 3,835,381  9/1974  Garretson et al. ............. 324/158 P
3,849,728  11/1974  Evans ............................ 324/158 P Primary Examiner—Ernest F. Karlsen
Attorney, Agent, or Firm—Birch, Stewart, Kolasch & Birch

[57] ABSTRACT

A fixed probe board to be used for testing semiconductor wafer chips. The probe board comprises a probe support base having four mutually tapered probe support surfaces, and a multiplicity of probes secured on the probe support surfaces with their forward contact tips lying in a common contacting plane. The four probe support surfaces are joined together along lines corresponding to extensions of two diagonal lines of a semiconductor wafer chip to be tested. The inner circumference of each probe support surface is arcuate so as to be approximately equally distanced from the corresponding side of the wafer chip. The probe surfaces have the same acute angle relative to their common contacting plane.

8 Claims, 9 Drawing Figures

FIXED PROBE BOARD

BACKGROUND OF THE INVENTION

1. Field of the Invention

The present invention relates to a fixed probe board which is useful for testing semiconductor devices formed on semiconductor wafers.

2. Description of the Prior Art

Among various procedural steps involved in the production of a semiconductor such as a monolithic semiconductor integrated circuit, the probing step has been regarded as a mere intermediate step of testing or inspection. However, when the entire process is generally divided into two procedures, i.e. one including steps up to the production of a masked wafer and the other including subsequent steps up to the production of a final product, the probing step constitutes a final inspection step in the procedure for the production of a wafer and thus plays an extremely important role in a sense that it gives a great influence over the labour-saving and work efficiency in the subsequent steps. Namely, automation of the subsequent steps has made it possible to produce final products with minimal production of defective products, and under the circumstances, the accuracy or precision of the inspection in the probing step has become a decisive factor for the yield of final products.

A fixed probe board is used in such a probing step. A typical fixed probe board is disclosed, for instance, in an article entitled "Use of Fixed Probe Card" in Electronic Materials (Special Edition of November 1970 issue) p. 145, published on Nov. 5, 1970, and in U.S. Pat. No. 3,835,381 to Oliver R. Garretson et al. In the above mentioned article, usefulness of the fixed probe board is described such that it has overcome a drawback of an adjustable multipoint probe i.e. poor operability for alignment or maintenance of the probes for mass production. The construction of this fixed probe board is disclosed in detail in the above mentioned U.S. Patent. This probe board (i.e. a test probe assembly) comprises a multiplicity of probes fixed by a support base and an adhesive layer in a conical radial array relative to a printed substrate.

Semiconductor chips to be tested, usually have a square or rectangular shape. Accordingly, the forward contact tips of the probes are necessarily arranged in a square or rectangular pattern corresponding to the arrangement of a multiplicity of electrodes (i.e. bonding pads) formed on the periphery of each semiconductor chip. When the probes are fixed in a conical radial array with a given acute angle relative to the printed substrate, as in the above mentioned conventional probe board, the lengths of the free ends of the test probes from the fixed positions to the respective forward tips differ from one another, and the vertical distances from the respective forward end portions of the probes to the face of the printed substrate differ from one another.

Namely, if the given acute angle is represented by $\theta$, and the difference in the lengths of the free ends is represented by $\Delta l$, the difference $\Delta h$ in the vertical distances is given by $\Delta h = \Delta l \sin \theta$. When the acute angle $\theta$ is set to be 9°, the difference $\Delta h$ in the vertical distances becomes to be 78 $\mu$m for every 0.5 mm difference $\Delta l$ in the lengths of the free ends. Accordingly, the difference $\Delta h$ in the vertical distances between a probe having a free end of a length l of 4 mm and a probe having a free end of a length l of 6 mm becomes to be as great as 313 $\mu$m.

In assembling the above probe board, firstly the probes are arranged to form the above mentioned conical radial array, and with use of an assembling tool having a positioning mask with a multiplicity of small holes corresponding to the electrodes to be tested, the forward tips of the probes are inserted into the small holes of the mask. In this state, the probes are fixed to a support base, Finally, the support base is attached to a printed substrate. Accordingly, in the assembled probe board, the forward contact tips of the probes have variations in the above mentioned vertical distances. Therefore, there is a serious disadvantage that it is then required to adjust the probes to bring their forward contact tips to a common plane with an accuracy of ±25 m. Such an adjustment is usually done manually by observation with naked eyes.

As the forward end portions of the probes are bent in a vertical direction, it is conceivable that the variations in the vertical distances may be corrected by adjusting the lengths of the forward ends from the bent portions to the respective forward tips. However, such a concept is not practical in that a number of different kinds of probes having minutely differing lengths of the forward ends from the bent portions to the forward tips will have to be prepared and will have to be properly selected at the time of assembling the probes.

In the above mentioned case, even when the adjustment is properly done by bringing the forward contact tips to a common plane, the lengths of the probes from the fixed portions to the respective forward ends differ from one another, and consequently, when the forward contact tips are pressed on the electrodes of a conductor chip to be tested, the contacting pressures imparted to the electrodes differ from one probe to another. The variations in the contacting pressures of the probes mean corresponding variations in the stress imparted to the probes, which in turn give rise to variations in the residual strain in the probes, thus leading to variations in the durability of the probes. Consequently, readjustment of the probes to correct the deviation of the forward contact tips from a common plane is frequently required, thus leading to shortening of the useful life of the probe board.

Further, the deviation of the forward contact tips from the common plane and the variations in the contacting pressures due to the differences in the lengths of the probes, bring about a so-called piezo effect whereby the crystal structure of the wafer chip is changed by uneven pressures imparted thereto, and consequently, the characteristics of the semiconductor elements will be changed. Thus, not only the wafer chip tested is thereby adversely affected, but also the test result thereby obtained will be unreliable.

SUMMARY OF THE INVENTION

Accordingly, it is an object of the present invention to provide a fixed probe board whereby a deviation of the forward contact tips of the probes from the common contacting plane can be minimized at the time of assembling and the contacting pressures of the probes can be made uniform.

Another object of the present invention is to provide a fixed probe board which can be manufactured with a low production cost.

The present invention provides a fixed probe board which comprises a probe support base having four mutually tapered probe support surfaces and a multiplicity of probes supported on said probe support surfaces with their forward contact tips lying in a common contacting plane. The four probe support surfaces are joined to one another along lines corresponding to extensions of two diagonal lines of a semiconductor wafer chip to be tested. Each probe support surface is arcuate so as to present an approximately equal distance from the corresponding side of the wafer chip. The probe support surfaces have the same acute angle relative to said common contacting plane.

The above and other objects and features of the present invention will become apparent from the following detailed description of preferred embodiments with reference to the accompanying drawings.

DETAILED DESCRIPTION OF THE PREFERRED EMBODIMENTS

Figure 1:
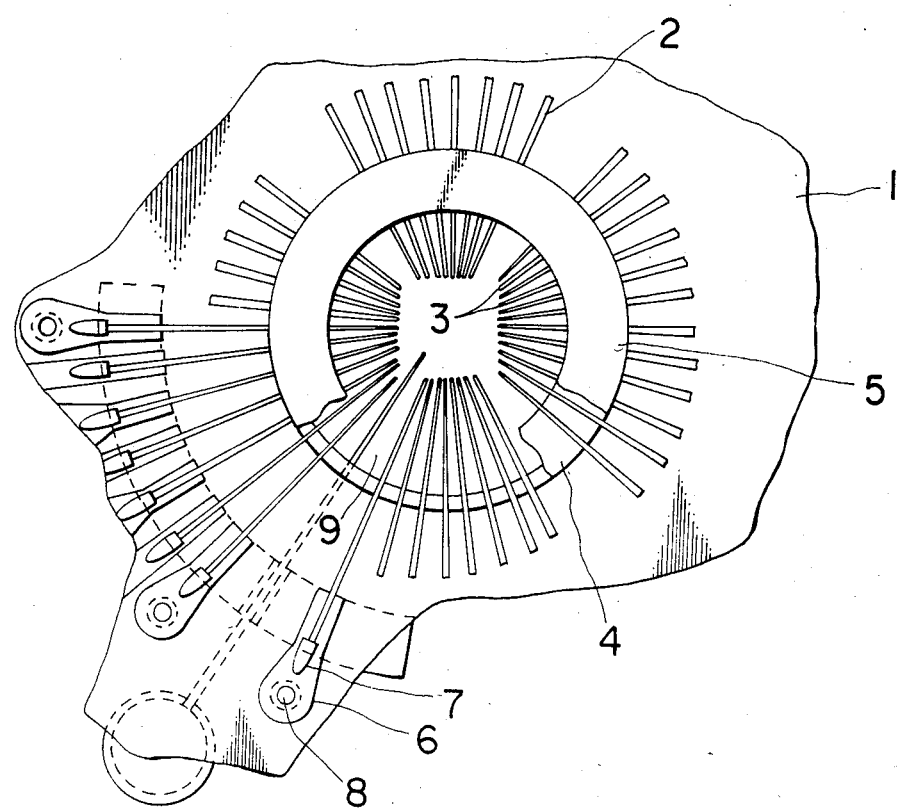
FIG. 1 is a plan view of a typical conventional fixed probe board.
Figure 2:
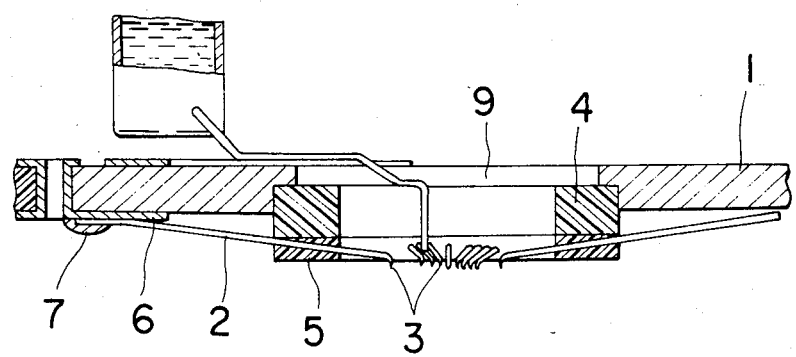
FIG. 2 is a cross sectional view of the conventional probe board.

FIG. 1 and 2 show a conventional fixed probe board as disclosed in U.S. Pat. No. 3,835,381, which comprises a printed substrate 1, a probe support base 4 mounted on the substrate 1, a multiplicity of probes 2 fixed to the probe support base 4 by an adhesive layer 5. Forward contact tips 3 of the probes are arranged to form a square pattern corresponding to a square semiconductor wafer chip to be tested, while the fixed portions of the probes 2 are on a circular ring of the probe support base 4. Consequently, the lengths of the free ends of the probes 2, i.e. the lengths from the forward contact ends to the respective fixed portions, vary from one probe to the next. The variations in the lengths of the free ends of the probes bring about various disadvanteges as mentioned above.

Now, the present invention will be described in detail with reference to preferred embodiments.

Figure 3:
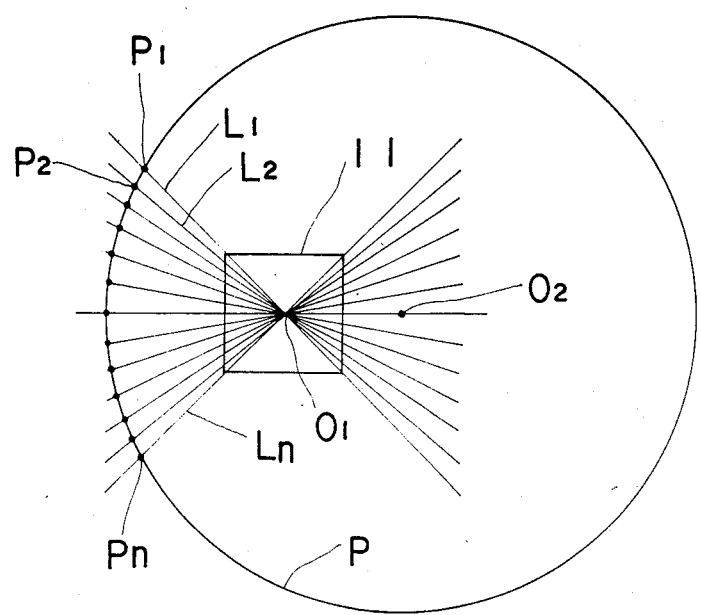
FIG. 3 is a schematic view illustrating the principle of the present invention.

FIG. 3 illustrates the principle of an embodiment of the present invention. In a case where a semiconductor wafer chip 11 has a square configuration as shown in FIG. 3, a number of radial lines $L_1, L_2 \ldots L_n$ passing through the center $\theta_1$ are drawn with respect to one side of the square, and points $P_1, P_2 \ldots P_n$ equally distanced from the side, are spotted on the respective lines.

The present inventor has found that the locus of these points $P_1, P_2 \ldots P_n$ quite well approximates an arc of a circle P drawn about the center $0_2$. By placing probes along the radial lines $L_1, L_2 \ldots L_n$, the free ends of the probes can be set to have an equal length based on this principle. This principle is likewise applicable to other sides of the squares.

Figure 4:
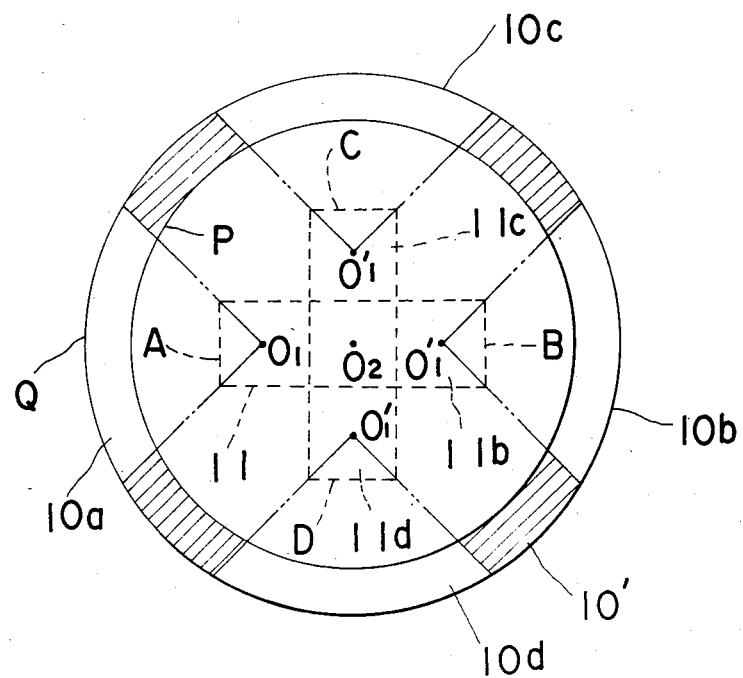
FIG. 4 is a plan view illustrating a manner for forming a probe support base according to the present invention.

FIG. 4 is a plan view illustrating a manner for forming a probe support base based on the above mentioned principle. For instance, with respect to a side A of a square wafer chip 11 as shown by a dotted line in the Figure, an arc of a circle P equally distanced from the side A is obtained in a manner similar to the above. A point $0_1$ is the center of the wafer chip 11, and a point $0_2$ is the center of the circle P. Then, an arc of a circle Q about the center $0_2$ is obtained. A ring 10' having the circle P as its inner circumference and the circle Q as its outer circumference is formed. The upper surface of this ring 10' is formed into a conical shape having an acute angle relative to the plane of the circle P or Q and immaginary apex at the center $0_2$. The ring 10' facing the side A is cut along lines corresponding to extensions of two diagonal lines of the wafer chip 11 passing through its center $0_1$.

With respect to a side B, a square 11b corresponds to the wafer chip 11 as the latter has been rotated in an arc of 180° about the center $0_2$, and the ring 10' is cut along lines corresponding to extensions of two diagonal lines of the square 11b passing through the center $0_1'$.

Likewise, with respect to sides C and D, squares 11c and 11d correspond to the wafer chip 11 as the latter has been rotated in an arc of 90° in the respective opposite directions about the center $0_2$, and the ring 10' is cut along lines corresponding to extensions of the diagonal lines of the respective centers $0_1'$.

Figure 5:
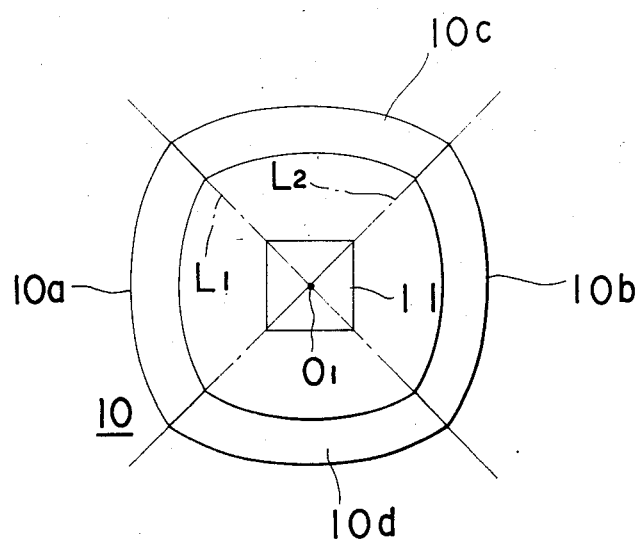
FIG. 5 is a plan view of an embodiment of the probe support base according to the present invention.

The four probe support base fragments 10a, 10b, 10c and 10d thereby obtained, are joined together along the cut faces to form an integral probe support base 10, as shown in FIG. 5. Thus, the inner circumference of each arcuate surface of this probe support base 10 is equally distanced from the corresponding side of the square wafer chip 11. The joined portions of the probe support base fragments 10a to 10d are along lines corresponding to extensions of the diagonal lines $L_1$ and $L_2$ of the wafer chip 11. Further, probe support surfaces of the respective support base fragments 10a to 10d are mutually tapered in a generally conical shape having its imaginary apex at the center $0_1$ of the wafer chip 11. This means that when the probes are secured to the probe support surfaces, the forward contact tips of the probes are brought in a common contacting plane, as will be described hereinafter.

Figure 6:
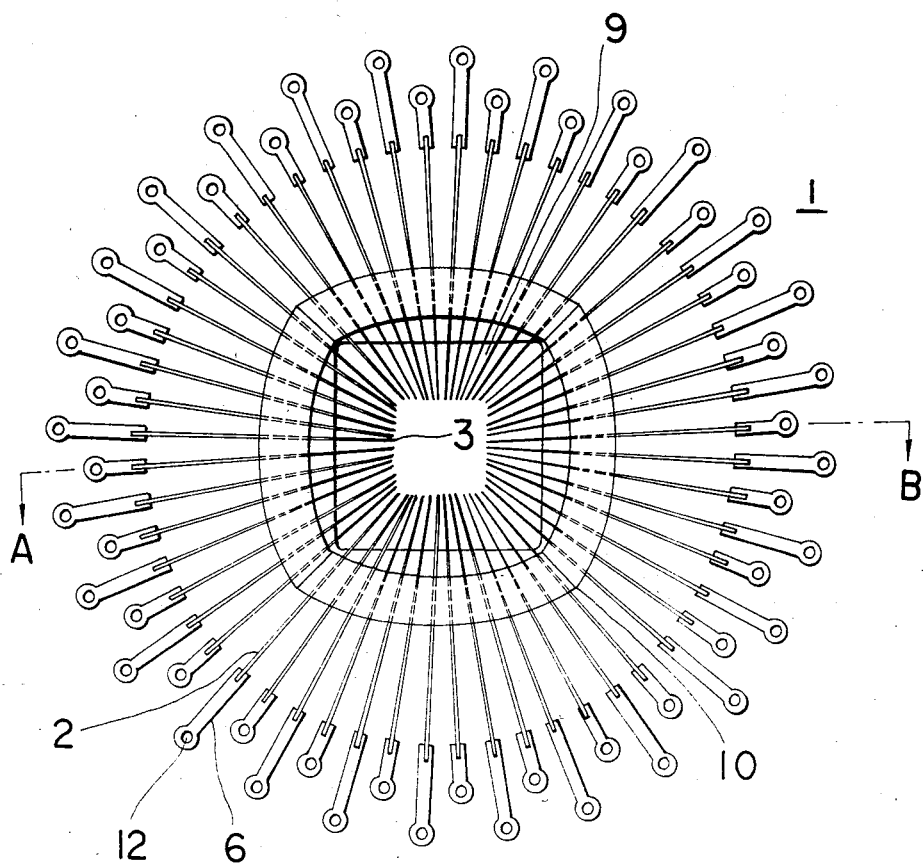
FIG. 6 is a bottom view of an embodiment of a fixed probe board according to the present invention.

FIG. 6 is a bottom view of an embodiment of a fixed probe board according to the present invention. In this embodiment, a printed substrate 1 has an opening 9, which is square. However, the shape of the opening may be other than the square. Within the opehing 9, forward contact tips 3 of a multiplicity of probes 2 are located at positions corresponding to the electrodes of a wafer chip to be tested. The square formed by these front contact tips corresponds to the periphery of the wafer chip. The probes 2 are radially arranged with the center of the square (i.e. the wafer chip) as the imaginary center of the radial arrangement.

These probes 2 are secured to the probe support base 10 by means of an adhesive which hardens naturally or upon application of heat. The adhesive layer is not shown in FIG. 6.

In this embodiment, the printed substrate 1 constitutes a probe holder as disclosed in Japanese Utility Model Publication No. 33504/78. Thus, the printed substrate 1 is provided with a number of printed circuit traces 6 which are connected to pins 12 extending through holes to the other side to constitute terminals. The connecting ends of the probes 2 are soldered to the respective printed circuit traces 6. As the probes 2 are radially arranged as mentioned above, the printed circuit traces 6 and pins 12 form a generally circular pattern. The probe holder having such a construction is mounted on a printed substrate (not shown) by a plug-in system.

The probes in this embodiment are made of a slender wire composed mainly of tungsten, so that resiliency is thereby obtained. Other materials may, of course, be used for the probes. The diameter of each probe is about 260 μm at the connecting end, and the probe is tapered toward its forward end so that the diameter thereof at the forward tip is about 50 μm. Further, in order to improve the conductivity and solderability of the probes, a suitable metal such as gold may be plated on the probes.

Further, the probes may directly be secured to a printed substrate, as shown in FIG. 1, which is to be mounted on a prober.

Figure 7:
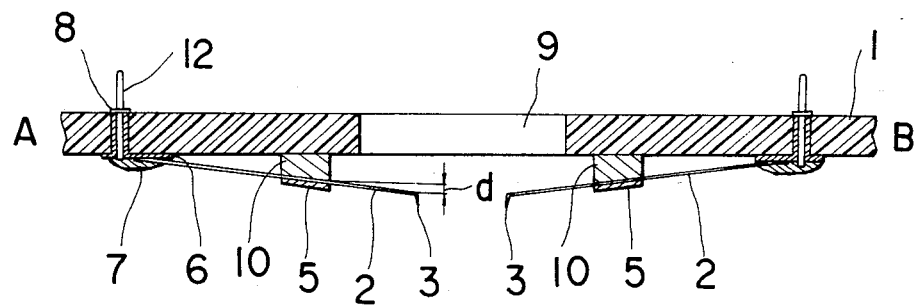
FIG. 7 is a cross sectional view thereof.

As shown in FIG. 7, the forward ends of the probes 2 are substantially vetically bent at positions corresponding to the electrodes to be tested (not shown), so that the forward contact tips 3 are in a common contacting plane corresponding to the plane of the electrodes. In this embodiment, the forward ends of the probes thus bent have an equal length.

FIG. 7 shows that the upper surface of the probe support base 10 is bonded to the bottom surface of the printed substrate 1, and the probe support surfaces are mutually tapered in a generally conical shape as mentioned above. It is also shown that the probes 2 supported on the probe support surfaces are embedded in an adhesive layer 5 of an electrically dielectric adhesive. Further, it is shown that the connecting ends of the probes are electrically connected to the printed circuit traces 6 by solder 7, and the pins 12 extend through holes 8 and protrude on the upper side.

As described in the forgoing, according to this embodiment, the support base 10 is composed of the probe support base fragments 10a to 10d which are arranged to correspond to the respective sides of a square formed by the electrodes provided along the periphery of the wafer chip, and thus, the free ends (from the support base to the forward contact tips) of the probes 2 arranged on the radial lines extending through the center of the wafer chip, have an equal or uniform length. Accordingly, the free ends of the probes have uniform resiliency to provide uniform contacting pressure when the contact tips of the probes are pressed on the electrodes of the wafer chip. Consequently, the stress imparted to the free ends of the probes will be even, and the residual strain created in the probes by repeated contacting operations will likewise be even. Accordingly, the dislocation of the forward contact tips of the probes from the initial common contacting plane occurs uniformly and the durability of the probes against repeated contacting operations will thereby be improved.

On the other hand, by virtue of the uniformity of the contacting pressure, the piezo effect which gives rise to adverse effects to the characteristics of the elements of the wafer chip, as mentioned above, can be minimized. In other word, it is possible to minimize the possibility that a good wafer chip is errorneously determined to be a defective product due to the piezo effect created in the good wafer chip. Thus, the reliability of the test results can thereby be ensured, and as a result, the yield of the products can be improved.

As mentioned above, the probe support base 10 is composed of four probe support base fragments 10a to 10d joined along the lines corresponding to the extensions of the two diagonal lines of the wafer chip and facing the respective sides of the wafer chip, and at the same time, the probe support surfaces of the support base fragments 10a to 10d respectively have an inclination of a conical surface. As shown in FIG. 4, these probe support surfaces are parts of the conical surface of the ring 10'. Accordingly, the probes radially supported on these support surfaces have a uniform acute angle relative to the common contacting plane, whereby as shown in FIG. 7, a vertical distance d of the free ends of the probes can be made uniform. As mentioned above, the bent forward ends of the probes 2 have an equal length. Accordingly, the forward contacting tips 3 form a common contacting plane without substantial deviation therefrom.

The conical surfaces of the respective probe support base fragments 10a to 10d constituting the probe support base are discontinuous along the joined lines. With use of such discontinuous probe support surfaces, it has been made possible to attain the uniformity of the length of the free ends of the probes and to improve the alignment of the forward contact tips in the common contacting plane.

Namely, when the probes are secured on a continuous conical surface as in the conventional fixed probe board disclosed in U.S. Pat. No. 3,835,381, it is impossible to obtain the uniformity of the length of the free ends of the probes, and it is difficult to obtain good alignment of the forward contact tips in the common contacting plane. As mentioned above, this is because the forward contact tips are arranged in a square pattern, while the probes are supported on the continuous conical surface.

Whereas, according to the present invention, it is possible to attain the uniformity of the length of the free ends of the probes and good alignment of the forward contact tips, based on a quite unique concept that the probes are supported on the same conical surface but partly cut away and joined together to form a generally conical supporting surface discontinous along the joined lines. Since the forward contact tips are thereby properly aligned in the common contacting plane, a step of correcting a deviation of the forward tips from the common contacting plane can be omitted, which is required in assemblying the conventional probe assembly. The production costs can be reduced with elimination of this step from the assembling operation.

Referring to FIG. 4, when four probe support base fragments 10a to 10d are taken from the ring 10', the portions indicated by oblique lines in the Figure are wasted. In order to minimize the waste portions, it is preferred to take, for instance, six probe support base fragments by shifting the location of the center $0_1'$. In this case, three probe support bases 10 can be fabricated from two rings 10'.

Figure 8:
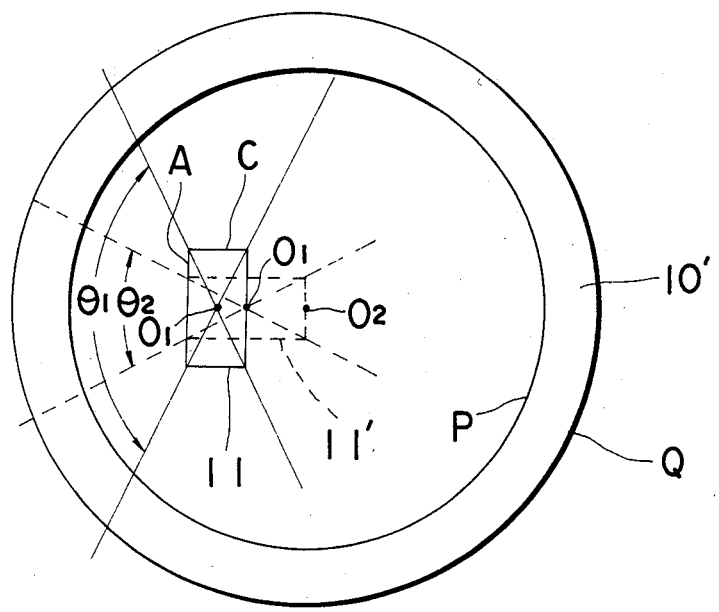
FIG. 8 is a plan view of another embodiment for forming a probe support base according to the present invention.

FIG. 8 is a plan view illustrating a manner for forming another probe support base according to the present invention.

In this embodiment, the present invention is applied with respect to a rectangular wafer chip 11 as indicated by a solid line in the Figure.

With respect to a longer side A of the rectangular wafer chip, an arc of a circle P equally distanced from the longer side is determined. A point $0_1$ is the center of the wafer chip, and a point $0_2$ is the center of the circle P. Then, an arc of circle Q is determined. A ring 10' having the circle P as its inner circumference and the circle Q as its outer cirmuference, is formed.

The arc of the circle P is also equally distanced from a shorter side C of the wafer chip, as shown by dotted lines in FIG. 8. A wafer chip 11' shown by the dotted line overlaps the wafer chip shown by the solid line, with its shorter side coinciding with the longer side of the wafer chip 11 and its center $0_1'$ is dislocated from the center of the wafer chip 11 toward the center $0_2$ of the circle P.

Accordingly, a support base fragment 10a corresponding to the longer side A is cut from the ring 10' at an angle $0_1$ between diagonal lines shown by solid lines. Whereas, a support base fragment 10c corresponding to the shorter side C is cut from the ring 10' at an angle $0_2$ between lines shown by dotted lines.

Figure 9:
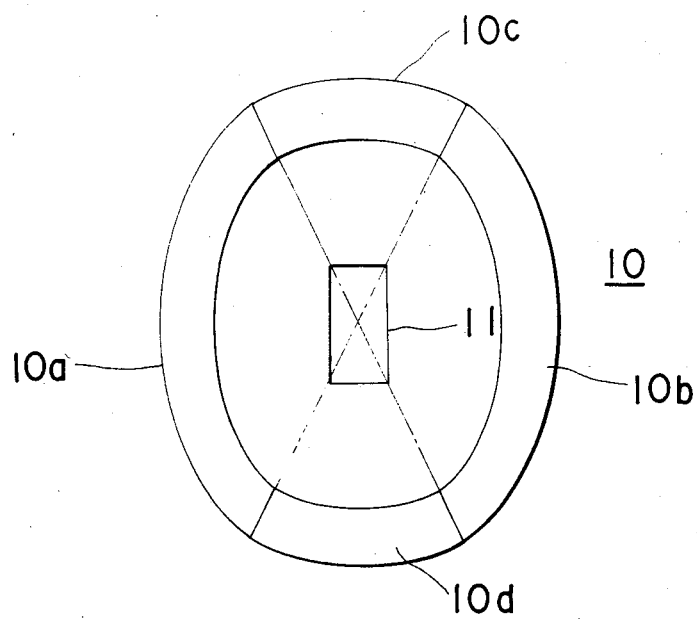
FIG. 9 is a plan view of another embodiment of the probe support base according to the present invention.

In this manner, the ring 10' is cut at angles $0_1$ and $0_2$, respectively, to form four support base fragments 10a to 10d, as shown in FIG. 9. The fragments are joined together to form a probe support base 10 corresponding to the rectangular wafer chip.

In a manner similar to the above, it is possible according to the present invention to prepare a probe support base 11 for any given quadrilateral wafer chip, in which the inner arcs corresponding to the respective sides of the wafer chip are equally distanced from the respective sides.

The probe support surfaces of the respective support base fragments 10a to 10d are formed with similarly tapered conical surfaces. Accordingly, the free ends of the probes secured radially on the probe support surfaces have a uniform length, and their forward contacting tips are naturally aligned in a common contacting plane.

The present invention is not limited to the above preferred embodiments.

For instance, the probe support base may integrally be formed by molding, thus eliminating a step of joining the support base fragments.

Referring to FIG. 7, the probe support base 10 and the adhesive layer 5 may be integrally formed with use of an adhesive forming the adhesive layer. Namely, with use of a mold for forming the probe support base, the probes are preliminarily arranged in a manner as described above, and then, a material such as the adhesive is poured into the mold to form a unitary structure. In this case, the number of components for the assembly is reduced, whereby the production cost can further be reduced, coupled with the above mentioned elimination of the necessity for adjusting the alignment of the contact tips.

Further, referring to FIG. 4 or 8, the outer circumference Q of the ring 10' may not necessarily be an arc of a circle. The radius of the inner circle P varies depending upon the length of the free ends of the probes and the length of the sides of a wafer chip. The essential point is that the inner circumference of each probe support surface is arcuate so as to be approximately equally distanced from the corresponding side of the wafer chip.

I claim:

1. A fixed probe board for testing semi-conductor wafer chips which comprises:
   a probe support base having four mutually tapered probe support surfaces arranged around a center point; and
   a multiplicity of probes having forward contact tips, all of said probes being radially supported around said center point on said probe support surfaces with said forward contact tips lying in a common plane and forming a quadrilateral shape, said four probe support surfaces being joined to one another along lines corresponding to extensions of two diagonal lines of said quadrilateral shape, the inner circumference of each probe support surface being arcuate so as to be substantially equally distanced from a corresponding side of said quadrilateral shape wherein the length of the inner ends of all of said probes from said inner circumference to said contact tips are substantially equal, said probe support surfaces having the same acute angle relative to said common plane.

2. The fixed probe board as claimed in claim 1, wherein said probes are radially arranged with an intersecting point of said two diagonal lines as the imaginary center of the radial arrangement.

3. The fixed probe board as claimed in claim 1 or 2, wherein said probes are fixed to the probe support surfaces by an electrically dielectric adhesive layer and embedded in the layer.

4. The fixed probe board as claimed in claim 1, wherein the forward contact tips of said probes form a square shape.

5. The fixed probe board as claimed in claim 1, wherein the forward contact tips of said probes form a rectangular shape.

6. A fixed probe for testing semiconductor wafer chips which comprises:
   a probe support base having four probe support surfaces arranged around a semiconductor chip to be center point wherein the inner circumference of each of said four probe support surfaces is arcuate; and a multiplicity of wire probes having forward contact tips, said probes being radially supported around said center point on said probe support surfaces, said probes extending from said probes support surfaces toward said center point wherein the forward contact tips of said probes are naturally arranged in a quadrilateral shape when placed on said support surface and lie in a common contacting plane, the length of the inner ends of all of said probes from said inner circumference to said contact tips are substantially equal and said probe support surfaces are arranged at an acute angle relative to said common contacting plane.

7. The fixed probe board as claimed in claim 1, wherein the inner circumference of each probe support surface corresponds to a continuous portion of a circle having a radius larger than the distance from said inner circumference to said center point.

8. The fixed probe board as claimed in claim 6, wherein the inner circumference of each probe support surface corresponds to a continuous portion of a circle having a radius larger than the distance from said inner circumference to said center point.

* * * * *